United States Patent [19]
Becker

[11] Patent Number: 5,881,008
[45] Date of Patent: Mar. 9, 1999

[54] SELF ADJUSTING PRE-CHARGE DELAY IN MEMORY CIRCUITS AND METHODS FOR MAKING THE SAME

[75] Inventor: Scott T. Becker, San Jose, Calif.

[73] Assignee: Artisan Components, Inc., Sunnyvale, Calif.

[21] Appl. No.: 928,713

[22] Filed: Sep. 12, 1997

[51] Int. Cl.[6] .................................................. G11C 7/02
[52] U.S. Cl. .................. 365/210; 365/203; 365/233.5
[58] Field of Search .................................. 365/210, 203, 365/233.5

[56] References Cited

U.S. PATENT DOCUMENTS

| | | | |
|---|---|---|---|
| 4,128,900 | 12/1978 | Lappington | 365/94 |
| 5,029,135 | 7/1991 | Okubo | 365/203 |
| 5,091,889 | 2/1992 | Hamano et al. | 365/233.5 |
| 5,146,427 | 9/1992 | Sasaki et al. | 365/189.05 |
| 5,214,609 | 5/1993 | Kato et al. | 365/230.01 |
| 5,311,471 | 5/1994 | Matsumoto et al. | 365/189.05 |
| 5,323,360 | 6/1994 | Pelley, III | 365/233.5 |
| 5,335,207 | 8/1994 | Takamoto | 365/233.5 |
| 5,404,334 | 4/1995 | Pascucci et al. | 365/210 |
| 5,414,663 | 5/1995 | Komared et al. | 365/210 |
| 5,459,689 | 10/1995 | Hikichi | 365/189.09 |
| 5,555,521 | 9/1996 | Hamada et al. | 365/185.03 |
| 5,561,629 | 10/1996 | Curd | 365/185.21 |
| 5,596,539 | 1/1997 | Passow et al. | 365/210 |
| 5,608,681 | 3/1997 | Priebe et al. | 365/207 |
| 5,625,586 | 4/1997 | Yamasaki et al. | 365/104 |
| 5,629,901 | 5/1997 | Ho | 365/230.05 |
| 5,636,161 | 6/1997 | Mann | 365/185.21 |
| 5,654,919 | 8/1997 | Kwon | 365/185.21 |
| 5,694,369 | 12/1997 | Abe | 365/210 |
| 5,699,295 | 12/1997 | Yero | 365/185.21 |

*Primary Examiner*—David Nelms
*Assistant Examiner*—VanThu Nguyen
*Attorney, Agent, or Firm*—Hickman & Martine, LLP

[57] ABSTRACT

An embedded memory device structure, and a method for making the embedded memory device structure having self adjusting pre-charge delay characteristics. The method includes selecting a desired memory array having a dummy column of cells. Coupling a pre-charge detect circuit to the dummy column of cells. The pre-charge detect circuit is configured to measure an activation and pre-charge response time of cells contained within the dummy column of cells. Transferring the activation and pre-charge response time to an address transition detect unit. The method further includes generating a custom clock timing signal in response to the activation and pre-charge response time of cells contained within the dummy column of cells.

21 Claims, 7 Drawing Sheets

5,881,008

SELF ADJUSTING PRE-CHARGE DELAY IN MEMORY CIRCUITS AND METHODS FOR MAKING THE SAME

BACKGROUND OF THE INVENTION

1. Field of the Invention

The present invention relates generally to integrated circuits, and more particularly to clock timing circuitry for use in memory devices.

2. Description of the Related Art

Most integrated circuit devices are required to have some type of memory device for storing information, and there is a growing trend to integrate embedded memory arrays directly onto the a chip, such as, a microprocessor, an application specific integrated circuit (ASIC), etc. Typically, when a memory device is embedded into a chip, the memory device (e.g., an Asynchronous SRAM) is provided with circuitry for writing and reading the data. By way of example, such common circuitry typically includes Y-decoders, X-decoders, sense amplifiers, output buffers, address transition detectors (ATD's) and clock buffers. Therefore, to produce a memory device that has fast access times and quick recoveries after a read/write operation, each of the components of the common circuitry must be tuned to eliminate delays or inefficiencies.

With this in mind, FIG. 1 shows a prior art block diagram of a memory 100 created from a generator that may be embedded into an integrated circuit design. The memory 100 is shown having a memory array 102, which is the main memory array having a plurality of memory cells that are arranged in a row and column format. Typically, memory 100 is provided with a row decode 104, a column decode 106, control circuitry 105, an address transition detect (ATD) 110, and sense amplifiers and output buffers 107. It is these circuit components that are used to facilitate the writing and reading of data to or from selected cells in the memory array 102.

When the memory has an address transition detect (ATD) circuit 110, the memory is typically considered to be an asynchronous memory device. This is because the address transition detect (ATD) 110 will produce a clock input signal that is analogous to that produced by a synchronous memory device. By way of example, a synchronous memory device will have a "clock input" signal that identifies a read or a write operation when a transition from LOW-to-HIGH (i.e., a rising edge) occurs, and commence a pre-charge operation when a transition from HIGH-to-LOW (i.e., a falling edge) occurs. As shown in a waveform 120, a time lapse between the falling edge and the next rising edge (i.e., when the next read or write operation occurs), is the time needed by the memory 100 to prepare itself for a next read or write operation. In this example, the ATD 110 is shown receiving an address transition input that provides information of when a memory address in the memory array 102 is to be accessed for a read or write operation.

Although the address transition detect (ATD) 110 is optimized to provide a clock input signal waveform 120 for a specific memory array 102, when the memory array 102 is replaced with a different size memory array produced by the memory generator, the ATD 110 will continue to produce the fixed clock input signal waveform. The possibility of interchanging different size memory arrays is not an uncommon occurrence. In fact, many companies implement what are known as core libraries, wherein the core libraries may include a plurality of memory arrays from which to pick an choose from. However, this increased flexibility may cause an integrated circuit design, e.g., a memory and ATD circuit to be improperly matched. That is, the fixed clock input signal waveform 120 that was well suited for a single memory size 100 may not be well suited for different size memories.

By way of example, if the new memory array is larger than the memory array that was previously produced by a memory generator, the pre-charge delay may be too short due to increased loading. Of course, when the pre-charge delay is too short, the more loaded memory array may not be ready to perform the next read or write operation. On the other hand, if the memory array 102 is replaced with a smaller sized memory array, then the fixed pre-charge delay may be too long, thereby causing a slow down in the rate at which a read or a write operation may be performed. In either case, the ATD 110 for a given memory will also have to be replaced and tuned at an increased cost each time the memory array 102 is modified.

In view of the foregoing, there is a need for a memory that has built-in circuitry for adjusting its clock input signal waveform in response to a change in memory size.

SUMMARY OF THE INVENTION

Broadly speaking, the present invention fills these needs by providing a memory circuit that automatically senses the load requirements of an existing memory array to enable a custom adjustment in its generated pre-charge delay. It should be appreciated that the present invention can be implemented in numerous ways, including as a process, an apparatus, a system, a device, or a method. Several embodiments of the present invention are described below.

In one embodiment, a method for making an embedded memory device is disclosed. The method includes selecting a desired memory array having a dummy column of cells. Coupling a pre-charge detect circuit to the dummy column of cells. The pre-charge detect circuit is configured to measure an activation and pre-charge response time of cells contained within the dummy column of cells. Transferring the activation and pre-charge response time to an address transition detect unit. The method further includes generating a custom clock timing signal in response to the activation and pre-charge response time of cells contained within the dummy column of cells.

In another embodiment, a memory device is disclosed. The memory device includes a memory array having a dummy column. A pre-charge detect unit that is coupled to the dummy column for measuring a response of the dummy column. The memory device further includes an address transition detect unit that is configured to receive an address transition signal for triggering a beginning of a pre-charge delay. The address transition detect unit is further configured to trigger an end of the pre-charge delay in response to a pre-charge detect signal that is provided by the pre-charge detect unit, in response to the measuring of the response of the dummy column.

In yet another embodiment, a memory generator is disclosed. The memory generator produces a memory array having a dummy column. A pre-charge detecting means that is coupled to the dummy column for measuring a response of memory cells in the dummy column. The memory further includes an address transition detecting means that is configured to receive an address transition signal for triggering a beginning of a pre-charge delay. The address transition detecting means is further configured to trigger an end of the pre-charge delay in response to a pre-charge detect signal that is provided by the pre-charge detecting means, in response to the measuring of the response of memory cells in the dummy column.

Advantageously, the various embodiments of the present invention provide methods and apparatuses for generating a clock timing signal waveform that is custom tailored to memory devices having memory arrays of varying sizes. More particularly, because each memory array is provided with a dummy column that can be sensed to ascertain a new memory array loading, the pre-charge delay will always be custom tailored to the loading requirements of a particular memory array. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for a memory that automatically senses the load requirements of an existing memory array to enable a custom adjustment in its generated pre-charge delay is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
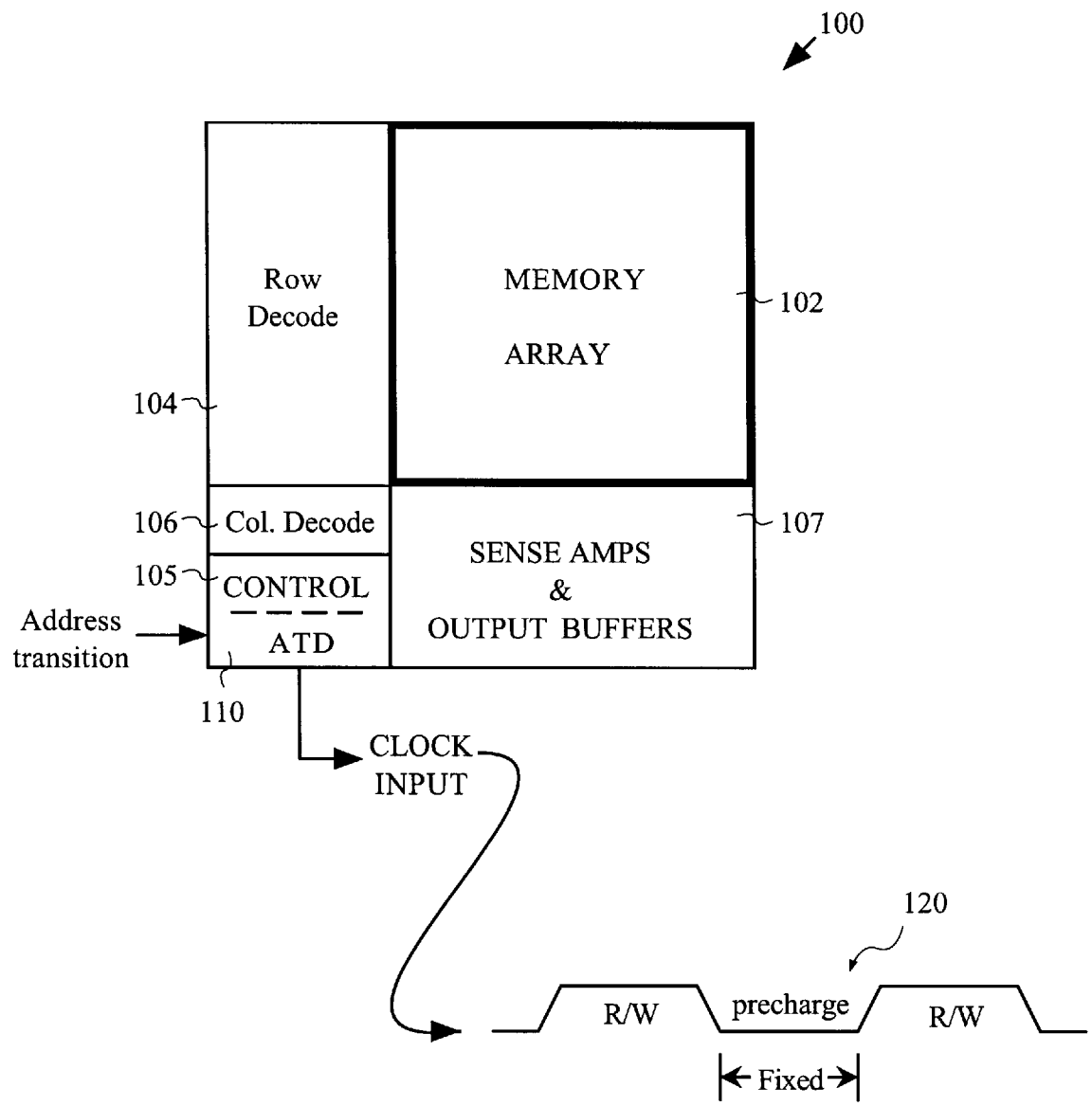
FIG. 1 shows a prior art block diagram of a memory that may be embedded into an integrated circuit design.
Figure 2:
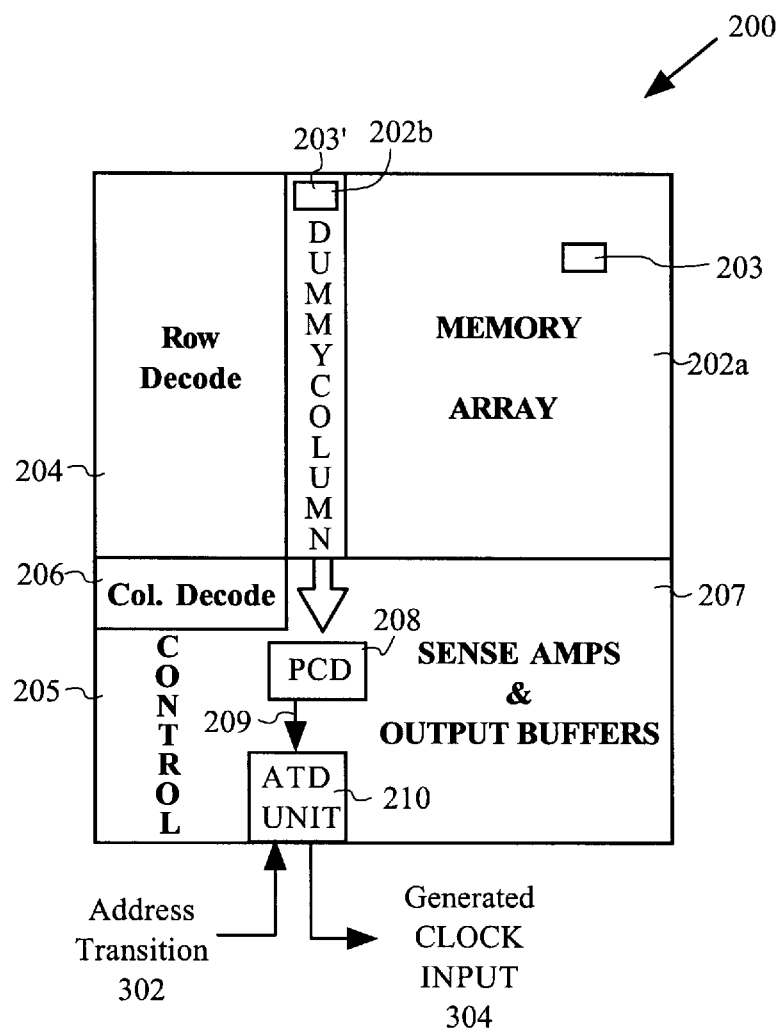
FIG. 2 shows a memory having a memory array of a predetermined size, and a dummy column in accordance with one embodiment of the present invention.

FIG. 2 shows a memory 200 created from a memory generator having a memory array 202a and a dummy column 202b in accordance with one embodiment of the present invention. In this embodiment, a pre-charge detect (PCD) 208 circuit is coupled to the dummy column 202b to enable the measurement of a custom pre-charge delay of a particular memory size. In this manner, the PCD 208 will be able to generate a signal 209 that is passed to an address transition detect (ATD) unit 210. ATD unit 210 is shown receiving an address transition signal 302 and outputting a generated clock input 304. These signals will be described in greater detail below with reference to FIG. 3.

As is common in memories, the memory 200 will also include a row decode 204, a column decode 206, control circuitry 205, sense amplifiers and output buffers 207. For more information on memory sense amplifiers and output buffers, reference may be made to commonly assigned U.S. patent applications: (1) entitled "Sense Amplifying Methods and Sense Amplification Integrated Circuit Devices," having Ser. No. 08/797,347, and filed on Feb. 11, 1997; (2) entitled "High Speed Memory Output Circuitry And Methods for Implementing Same," having Ser. No. 08/806,335, and filed on Feb. 26, 1997; (3) entitled "High Speed Addressing Buffer and Methods For Implementing Same," having Ser. No. 08/837,611, and filed on Apr. 21, 1997; and (4) entitled "Voltage Sense Amplifier and Methods For Implementing the Same," having Ser. No. 08/839,151, and filed on Apr. 23, 1997. All above identified U.S. patent applications are incorporated by reference herein.

In a preferred embodiment, a dummy cell 203', that is contained within the dummy column 202b is well suited to match the loading and associated delay of a memory cell 203 of the memory array 202a. As such, the pre-charge detect (PCD) 208 is well suited to sense the actual loading experience by a cell 203', which thereby enables the generation of a signal 209 that is passed to the ATD unit 210. In this manner, ATD unit 210 will output a generated clock input 304 waveform that is custom generated for the memory array 202a and its associated dummy column 202b. Accordingly, when the memory array 202a is replaced, the associated dummy column 202b should also be replaced to ensure that the PCD 208 is sensing the actual loading of a new memory array 202a. As such, if the memory array 202a and dummy column 202b is replaced at any time during initial design or future modifications, the generated clock input 304 waveform will always be optimized for the current memory array that may be produced by a memory generator.

Figure 3:
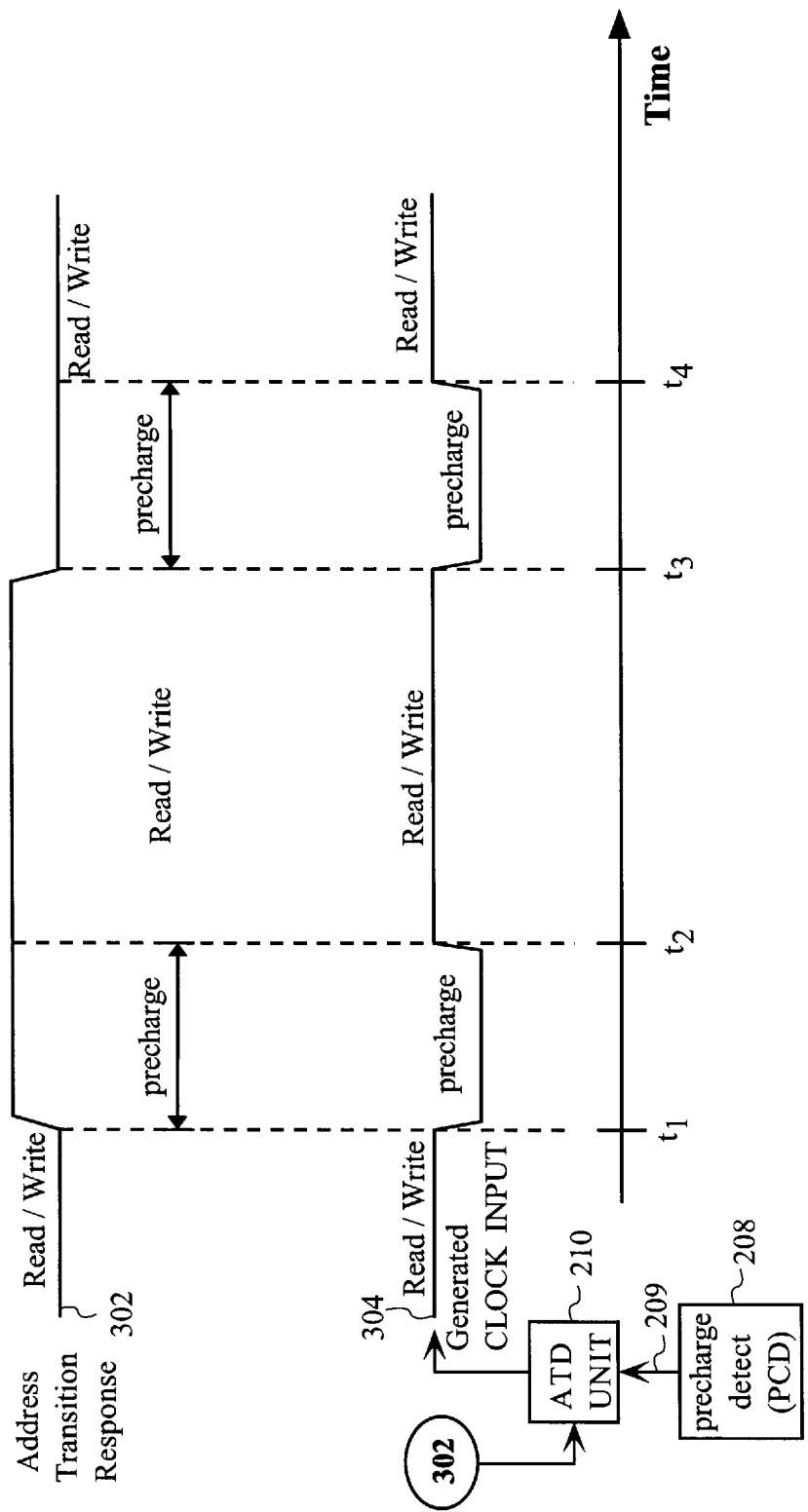
FIG. 3 shows timing diagrams of an address transition response and a custom generated clock input signal in accordance with one embodiment of the present invention.

FIG. 3 shows timing diagrams of an address transition response 302 and a generated clock input 304 in accordance with one embodiment of the present invention. The address transition response 302 is shown beginning in a low state where a read or write operation to a cell 203 that lies within the memory array 202a is occurring. At a time $t_1$, a rising edge occurs, which signals the end of the read or write operation and the beginning of a pre-charged time that continues until a time $t_2$. When the circuitry of the memory 200 has completed its pre-charge stage at time $t_2$, a read or write operation will again commence. This read or write operation is shown to be in progress up to a time $t_3$, where a falling edge occurs. After the falling edge, a pre-charge time will again continue up to a time $t_4$.

Again, the pre-charge delay that lasts between time $t_3$ and time $t_4$ will be a pre-charge time that is custom sensed based on the loading response of the cell 203' that lies within the dummy column 202b of FIG. 2. When the pre-charging is complete, at a time $t_4$, a read or write operation may again commence. Shown directly below the address transition response 302, is the generated clock input 304. For ease of reference, the pre-charge detect (PCD) 208 is shown feeding signal 209 to the address transition (ATD) unit 210. Address transition unit (ATD) 210 is also shown receiving the address transition response 302, which enables it to generate the custom produced clock input 304.

By way of example, the custom generated clock input 304 will trace the actual response of a cell within the dummy column 202b, thereby producing a pre-charge delay pulse that may be custom tailored to any memory array that may be integrated into a memory device, such as, an asynchronous SRAM memory device. As shown, the generated clock input 304 is shown beginning at a read or a write operation when 304 is high. At time $t_1$, a falling edge occurs, which commences the a pre-charge delay at lasts up to a time $t_2$. At time $t_2$, a rising edge occurs when a new read or write operation is performed to the memory array 202a.

At a time $t_3$, a falling edge will again occur when the read or write operation is complete, and the custom pre-charge delay commences. The pre-charge delay will therefore last until time $t_4$ where a rising edge signals the beginning of the next read or write operation. As can be appreciated, the pre-charge delays that lie between time $t_1$ through $t_2$, and time $t_3$ through time $t_4$ are custom tailored to the address transition response signal 302, which is sensed from the cell 203' of the dummy column 202b, as shown in FIG. 2.

Figure 4:
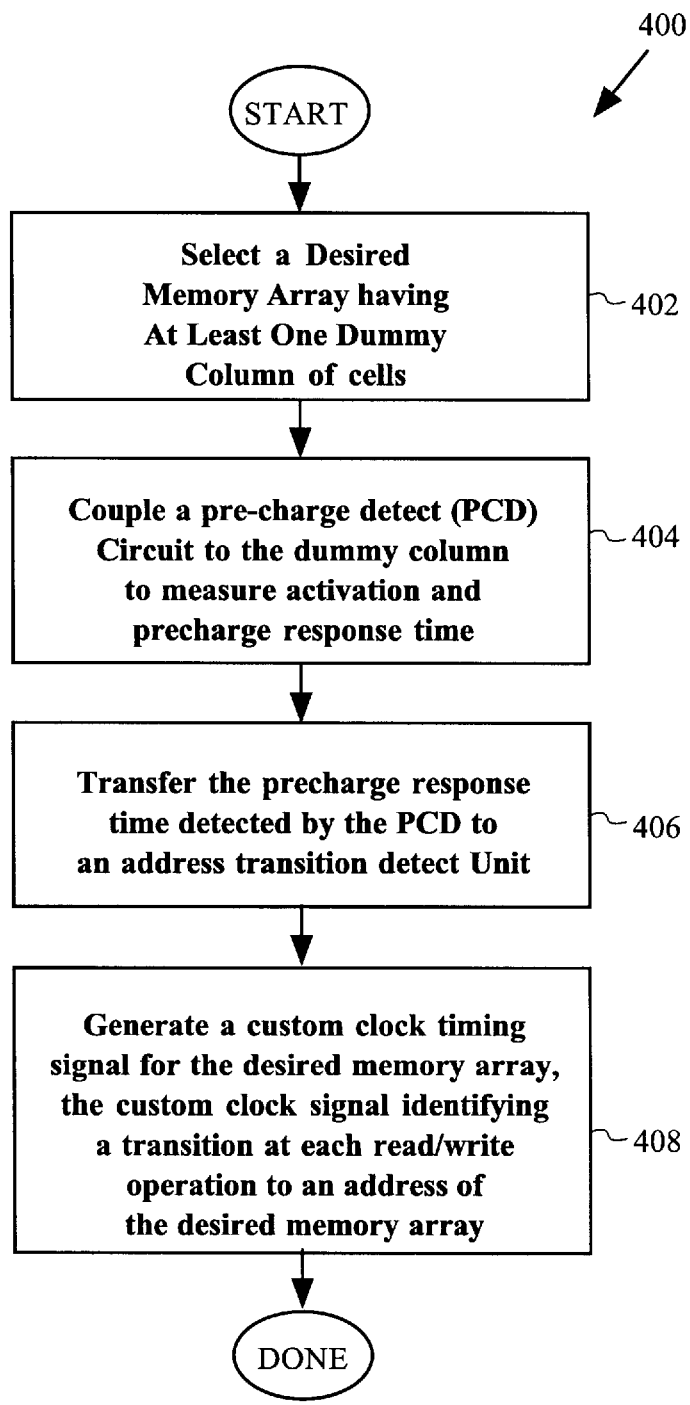
FIG. 4 is a flowchart diagram illustrating the preferred method operations that may be performed to construct a custom clock timing generator for asynchronous memory arrays of varying sizes in accordance with one embodiment of the present invention.

FIG. 4 is a flowchart diagram 400 illustrating the preferred method operations that may be performed to construct a custom clock timing generator for asynchronous memory arrays of varying sizes in accordance with one embodiment of the present invention. The method begins at an operation 402 where a desired memory array having at least one dummy column of cells is selected. By way of example, the memory array may be a 2,000 row×16 bit, a 4,000 row×32 bit, or any other memory size that may be desired for a particular application. In a preferred embodiment, the custom memory array will also have at least one dummy column of cells to enable appropriate load measurement during their response. It should be appreciated that the actual size of the selected memory array is not important since the dummy column of the provided memory array will be sensed to determine an appropriate pre-charge delay.

Once a desired memory array has been selected in operation 402, the method will proceed to an operation 404 where a pre-charged detect (PCD) circuit is coupled to the dummy column provided in operation 402 to measure its activation and pre-charge response time. Next, the method will proceed to an operation 406, where the pre-charge response time that was detected by the pre-charge detect (PCD) is transferred to an address transition detect unit. Once transferred to the address transition detect unit, the method will proceed to an operation 408 where a custom clock timing signal is generated by the address transition detect unit for the desired memory array selected in operation 402. The custom clock signal will therefore identify a transition (i.e., a rising edge that begins from a low pre-charge delay state) at each read/write operation to an address of the desired memory array.

The custom clock timing signal will therefore have a pre-charge delay that is custom tailored to a desired memory array, thereby preventing pre-charge delays that are either too short or too long. Therefore, once the custom clock timing signal is generated in operation 404, the method will be done.

Figure 5:
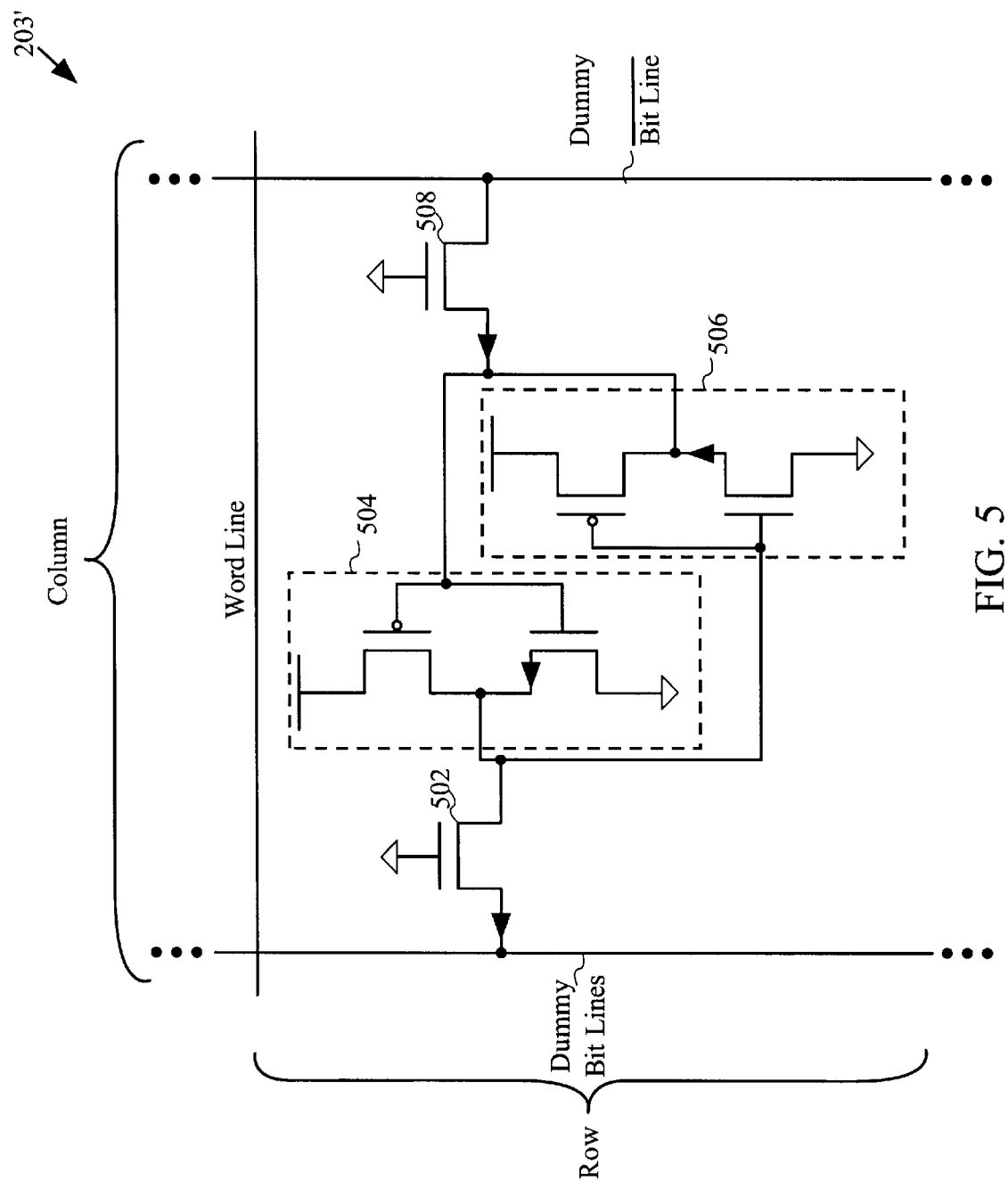
FIG. 5 shows an exemplary memory cell that may be contained within a dummy column of FIG. 2 in accordance with one embodiment of the present invention.

FIG. 5 shows an exemplary memory cell 203' that may be contained within the dummy column 202b of FIG. 2 in accordance with one embodiment of the present invention. In this embodiment, the cell 203' is a six transistor core cell having its wordline tied to LOW. In general, the six transistor core cell has a transistor 502 coupled to a bit line, and a transistor 508 coupled to a complimentary bit line (i.e., /bit line). Between transistors 502 and 508 lie two inverters 504 and 506. Thus, the exemplary cell 203' that is defined within the dummy column 202b is well suited to match the loading experienced in a cell 203 that lies within the memory array 202a of FIG. 2.

Figure 6A:
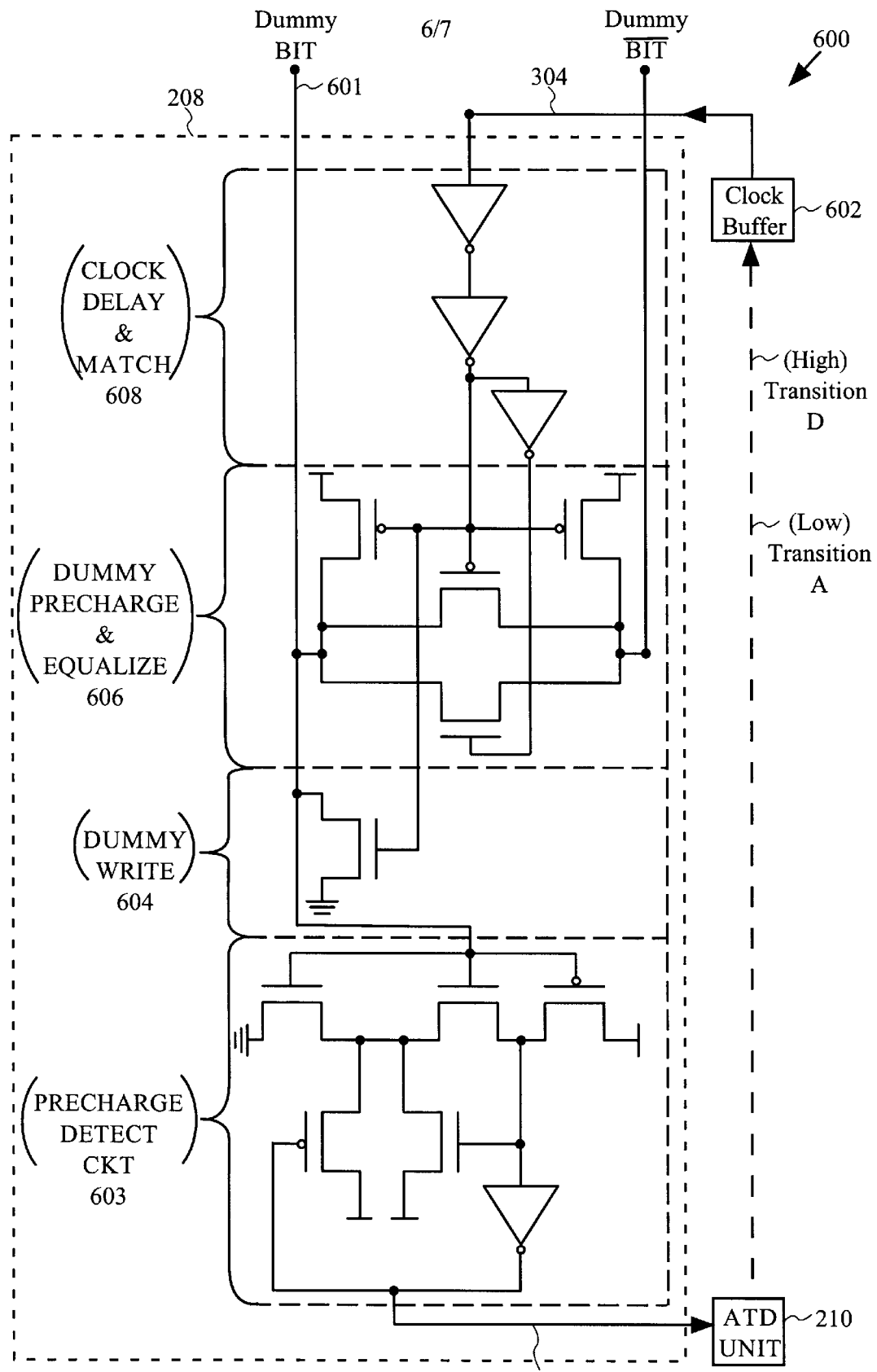
FIG. 6A shows a circuit diagram, that is a main circuit component contained within a pre-charge detect unit of FIG. 2 in accordance with one embodiment of the present invention.

FIG. 6A shows a circuit diagram 600, that is a main circuit component contained within the pre-charge detect 208 of FIG. 2 in accordance with one embodiment of the present invention. In this embodiment, the pre-charge detect 208 includes a pre-charge detect circuit 603, a dummy write transistor 604, a dummy pre-charge and equalize circuit 606, and a clock delay and match circuit 608. The pre-charge detect circuit 603 is well suited to produce the signal 209 that is fed into the ATD unit 210 as described above.

The dummy write transistor 604 is preferably used to approximate a worst case voltage transition that may occur prior to pre-charge. A write operation is preferably used instead of a read operation because pre-charging usually takes longer after a write operation. The clock delay and match circuitry 608 is generally well suited to approximate the clock loading that is experienced during a read or write operation to a cell within the memory array 202a of FIG. 2. The ATD unit 210 will therefore generate a clock input signal that is passed through a clock buffer 602, before the generated clock input 304 is custom produced.

Figure 6B:
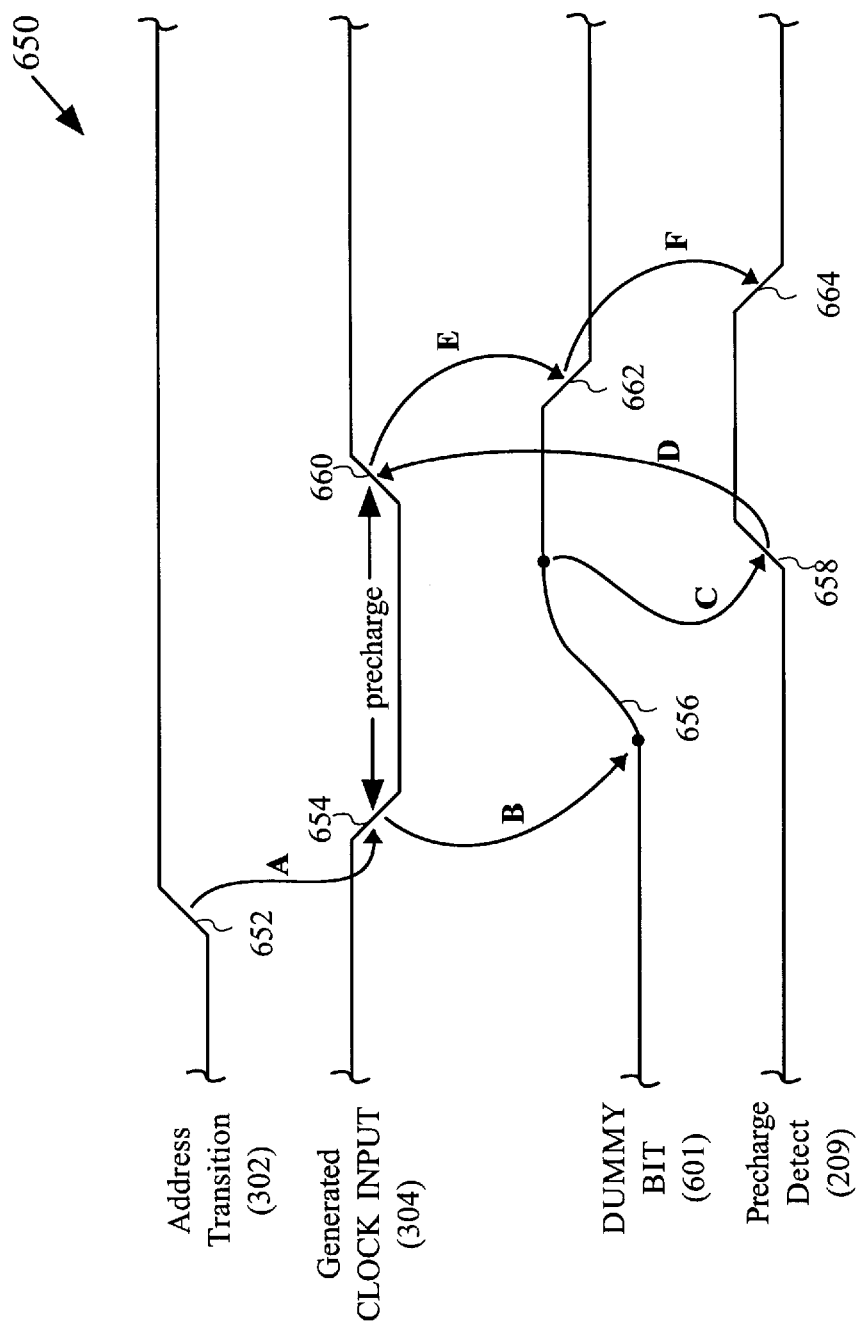
FIG. 6B are timing waveforms that shown exemplary circuit transitions of FIG. 6A in accordance with one embodiment of the present invention.

Reference will now be made to FIG. 6B where timing waveforms 650 are shown illustrating the circuit transitions of FIG. 6A in accordance with one embodiment of the present invention. The first waveform from the top is the address transition waveform 302 that has a rising edge at 652. Rising edge 652 will therefore cause a transition A in the generated clock input 304. The generated clock input 304 will experience a falling edge at 654, which commences the custom pre-charge delay in the generated clock input 304. The falling edge 654 will then cause a transition B in the dummy bit 601. The dummy bit 601 waveform will therefore experience a slowly rising edge 656. The rising of edge 656 will therefore cause a transition C to a pre-charge detect signal 209. Pre-charge detect signal 209 will then experience a rising edge at 658, which in turn causes transition D.

Transition D will then cause a rising edge 660 in the generated clock input 304, which signals the end of a custom tailored pre-charge delay. Transition 660 will also cause a transition E to dummy bit 601 at a falling edge 662. Falling edge 662 will in turn cause a transition F to the pre-charge detect signal 209. Transition F will then cause a falling edge 664 in the pre-charge detect signal 209, which terminates the custom pre-charge delay that lies between falling edge 654 and rising edge 660 in the generated clock input 304.

As can be appreciated, the waveforms of FIG. 6B clearly shows that the transition 652 in the address transition 302 causes the beginning of the custom pre-charge delay in the generated clock input 304. Further, the end of the custom pre-charge delay is triggered by the rising edge 658 in the pre-charge detect signal 209. Therefore, no matter what size memory array is selected to be integrated into a memory, the pre-charge delay will always be custom generated.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation. By way of example, hardware description language (HDL) design and synthesis programs, such as, VHDL® hardware description language available from IEEE of New York, N.Y. may be implemented to design the silicon-level layouts. Accordingly, the present embodiments are to be considered as illustrative and not restrictive, and the invention is not to be limited to the details given herein, but may be modified within the scope and equivalents of the appended claims.

What is claimed is:

1. A method for making an embedded memory device, comprising:

selecting a desired memory array having a dummy column of cells for approximating a loading of the desired memory array;

coupling a pre-charge detect circuit to the dummy column of cells, the pre-charge detect circuit being configured to measure an activation and pre-charge response time of cells contained within the dummy column of cells;

transferring the activation and pre-charge response time to an address transition detect unit through a clock buffer that is also configured to approximate the loading of the desired memory array; and generating a custom clock timing signal in the form of an output of the clock buffer in response to the activation and pre-charge response time of cells contained within the dummy column of cells.

2. A method for making an embedded memory device as recited in claim 1, wherein the custom clock timing signal is a waveform that is high when a read or write operation is occurring and the waveform is a low when a pre-charge operation is occurring.

3. A method for making an embedded memory device as recited in claim 2, wherein the pre-charge operation has a duration that is variable depending on a size of the desired memory array.

4. A method for making an embedded memory device as recited in claim 3, wherein the duration of the pre-charge operation is shorter when the size of the desired memory array is smaller.

5. A method for making an embedded memory device as recited in claim 3, wherein the duration of the pre-charge operation is longer when the size of the desired memory array is larger.

6. A method for making an embedded memory device as recited in claim 1, wherein the embedded memory device is an asynchronous SRAM.

7. A memory device, comprising:

a memory array having a dummy column;

a pre-charge detect unit being coupled to the dummy column for measuring a response of the dummy column; and an address transition detect unit configured to receive an address transition signal for triggering a beginning of a pre-charge delay, the address transition detect unit further being configured to trigger an end of the pre-charge delay in response to a pre-charge detect signal that is provided by the pre-charge detect unit in response to the measuring of the response of the dummy columns;

wherein the pre-charge detect unit includes a clock delay and match circuit that outputs a clock signal that approximates a clock loading in the memory array.

8. A memory device as recited in claim 7, wherein the pre-charge detect unit includes a clock delay and match circuit that outputs a clock signal that approximates a clock loading in the memory array.

9. A memory device as recited in claim 8, wherein the pre-charge detect unit includes a dummy pre-charge and equalize circuit that receives the clock signal from the clock delay and match circuit, the dummy pre-charge and equalize circuit being coupled to a dummy bit line and a complementary dummy bit line.

10. A memory device as recited in claim 9, wherein the dummy pre-charge and equalize circuit and the dummy bit line is coupled to a dummy write transistor, the dummy write transistor being configured to approximate a worst case response in the memory array.

11. A memory device as recited in claim 10, wherein the dummy write transistor is coupled as an input to a pre-charge detect circuit, the pre-charge detect circuit being configured to produced the pre-charge detect signal that is passed to the address transition detect unit.

12. A memory device as recited in claim 7, further comprising a sense amplifier and an output buffer.

13. A memory device as recited in claim 12, further comprising a row decoder, a column decoder and control circuitry.

14. A memory device as recited in claim 13, wherein a cell in the dummy column is a six transistor cell having a wordline tied to a low.

15. A memory device as recited in claim 14, wherein the memory device is an asynchronous SRAM.

16. A memory generator for producing a memory device, comprising:

a memory array having a dummy column;

a pre-charge detecting means being coupled to the dummy column for measuring a response of memory cells in the dummy column; and an address transition detecting means being configured to receive an address transition signal for triggering a beginning of a pre-charge delay, the address transition detecting means further being configured to trigger an end of the pre-charge delay in response to a pre-charge detect signal that is provided by the pre-charge detecting means in response to the measuring of the response of memory cells in the dummy column;

wherein the pre-charge detecting unit includes a means for delaying and matching a clock signal, the clock signal being configured to approximate a clock loading in the memory array.

17. A memory generator for producing a memory device as recited in claim 16, wherein the pre-charge detecting unit includes a means for delaying and matching a clock signal, the clock signal being configured to approximate a clock loading in the memory array.

18. A memory generator for producing a memory device as recited in claim 16, wherein the pre-charge detecting means includes a dummy pre-charge and equalize circuit that receives the clock signal, the dummy pre-charge and equalize circuit being coupled to a dummy bit line and a complementary dummy bit line, the pre-charge detecting means being configured to match a response of a normal column in the memory array.

19. A memory generator for producing a memory device as recited in claim 18, wherein the dummy pre-charge and equalize circuit and the dummy bit line is coupled to a dummy write transistor, the dummy write transistor is configured to approximate a worst case response in the memory array.

20. A memory generator for producing a memory device as recited in claim 19, wherein the dummy write transistor is coupled as an input to a pre-charge detect circuit, the pre-charge detect circuit being configured to produced the pre-charge detect signal that is passed to the address transition detecting means.

21. A memory generator for producing a memory device as recited in claim 19, wherein the memory device is an asynchronous SRAM.

* * * * *